(12) United States Patent
Morozumi et al.

(10) Patent No.: US 8,079,677 B2
(45) Date of Patent: Dec. 20, 2011

(54) LIQUID EJECTING HEAD, LIQUID EJECTING APPARATUS, AND PIEZOELECTRIC ACTUATOR

(75) Inventors: Koichi Morozumi, Suwa (JP); Jiro Kato, Suwa (JP); Satoshi Denda, Suwa (JP); Ichiro Asaoka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 133 days.

(21) Appl. No.: 12/501,740

(22) Filed: Jul. 13, 2009

(65) Prior Publication Data

US 2010/0007707 A1   Jan. 14, 2010

(30) Foreign Application Priority Data

Jul. 14, 2008   (JP) .................. 2008-183138

(51) Int. Cl.
*B41J 2/045* (2006.01)
*H01L 41/00* (2006.01)
(52) U.S. Cl. .......................... 347/71; 310/365
(58) Field of Classification Search ................ 347/71
See application file for complete search history.

(56) References Cited

U.S. PATENT DOCUMENTS 6,051,914 A * 4/2000 Nishiwaki ............... 310/358
2005/0052506 A1 * 3/2005 Yagi et al. ................ 347/72

FOREIGN PATENT DOCUMENTS

JP   2003-127366   5/2003

* cited by examiner

*Primary Examiner* — Matthew Luu
*Assistant Examiner* — Lisa Solomon
(74) *Attorney, Agent, or Firm* — Workman Nydegger

(57) ABSTRACT

A liquid ejecting head includes a pressure generating chamber that is communicated with a nozzle opening and a piezoelectric element includes a first electrode formed above the pressure generating chamber, a piezoelectric layer formed above the first electrode, and a second electrode formed above the piezoelectric layer. In addition, an amorphous layer including an amorphous material is formed on a surface of the piezoelectric layer at the second electrode side.

6 Claims, 4 Drawing Sheets

LIQUID EJECTING HEAD, LIQUID EJECTING APPARATUS, AND PIEZOELECTRIC ACTUATOR

CROSS-REFERENCE TO RELATED APPLICATIONS

This application claims the benefit of priority to Japanese Patent Application No. 2008-183138 filed Jul. 14, 2008, the contents of which are hereby incorporated by reference in their entirety.

BACKGROUND

1. Technical Field

The present invention relates to a liquid ejecting head and a liquid ejecting apparatus that eject liquid from a nozzle opening, and a piezoelectric actuator that includes a first electrode, a piezoelectric layer and a second electrode.

2. Related Art

As piezoelectric elements that are piezoelectric actuators used for a liquid ejecting heads, there are piezoelectric elements that have a configuration in which a piezoelectric layer formed of a piezoelectric material exhibiting an electromechanical conversion function, for example, a crystallized dielectric material is interposed between two electrodes. The above-described piezoelectric element is mounted in a liquid ejecting head as an actuator device of a flexible vibration mode. In addition, as a representative example of the liquid ejecting head, there is an ink jet recording head in which, for example, a part of the pressure generating chamber communicated with the nozzle opening that ejects ink droplets is configured as a vibration plate, and ink inside the pressure generating chamber is pressed by deforming the vibration plate by using the piezoelectric element so as to be ejected as ink droplets from the nozzle opening.

In addition, as the piezoelectric elements mounted in the ink jet recording head, for example, there are piezoelectric elements that are formed so as to be independent from each pressure generating chamber by the forming of a uniform piezoelectric material layer over the entire surface of the vibration plate by using film forming technology and dividing the piezoelectric material layer into a shape corresponding to pressure generating chambers by using a lithographic method (for example, see JP-A-2003-127366 (Claims 4 to 7, FIGS. 1 to 4).

The above-described piezoelectric actuators are expected to achieve a longer life by the preventing of a leakage path of the piezoelectric layer, increasing the insulating property, and suppressing the heat generation of the piezoelectric element.

The above-described problem is not limited to the ink jet recording head and also exists in liquid ejecting heads that eject liquid other than ink. In addition, the above-described problem is not limited to the piezoelectric element that is used in a liquid ejecting head and also exists in piezoelectric actuators that are used in different devices.

SUMMARY

An advantage of some aspects of the invention is that it provides a liquid ejecting head, a liquid ejecting apparatus, and a piezoelectric actuator capable of improving the durability thereof and achieving a longer life.

According to a first aspect of the invention, there is provided a liquid ejecting head including: a pressure generating chamber that is communicated with a nozzle opening; and a piezoelectric element that generates a change of pressure in the pressure generating chamber and includes a piezoelectric layer, a first electrode that is formed on the pressure generating chamber side of the piezoelectric layer, and a second electrode that is formed on the side of the piezoelectric layer that is located opposite to the first electrode. In addition, an amorphous layer formed of an amorphous material is included on the surface layer of the second electrode side of the piezoelectric layer.

According to the above-described liquid ejecting head, the second electrode and the crystallized area of the piezoelectric layer are not brought into direct contact with each other due to placement of the amorphous layer. Accordingly, a grain boundary, a domain boundary, or the like of the crystallized area of the piezoelectric layer can be prevented from becoming a leakage path. Therefore, destruction of or heat generation in the piezoelectric element can be prevented, and a longer life thereof can be achieved.

In the above-described liquid ejecting head, it is preferable that the piezoelectric layer contains lead, zirconia, and titanium. In such a case, by using a piezoelectric layer formed from specific materials, desired piezoelectric characteristics can be acquired with a low voltage.

In addition, in the above-described liquid ejecting head, it is preferable that the piezoelectric layer and the amorphous layer have the same composition. In such a case, the amorphous layer can be easily formed in a simple manner and problems, such as interlayer peel-off between the amorphous layer and other crystallized areas, can be prevented.

In addition, in the above-described liquid ejecting head, it is preferable that the second electrode is formed of iridium. In such a case, an electric field can be reliably applied to the piezoelectric element by using the electrode with the desired conductivity.

According to a second aspect of the invention, there is provided a liquid ejecting apparatus that includes the above-described liquid ejecting head.

According to the aspect above, a liquid ejecting apparatus capable of improving durability and a longer life can be achieved.

According to a third aspect of the invention, there is provided a piezoelectric actuator including: a substrate; a piezoelectric layer that is formed on the upper side of the substrate; a first electrode that is formed on the substrate side of the piezoelectric layer; and a second electrode that is formed on the side of the piezoelectric layer that is located opposite to the first electrode. In addition, an amorphous layer formed of an amorphous material is included on a surface layer of the second electrode side of the piezoelectric layer.

According to the above-described piezoelectric actuator, the second electrode and the crystallized area of the piezoelectric layer are not brought into direct contact with each other due to placement of the amorphous layer. Accordingly, a grain boundary, a domain boundary, or the like of the crystallized area of the piezoelectric layer can be prevented from becoming a leakage path. Therefore, destruction of or heat generation in the piezoelectric actuator can be prevented, and a longer life thereof can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail.

Embodiment 1

Figure 1:
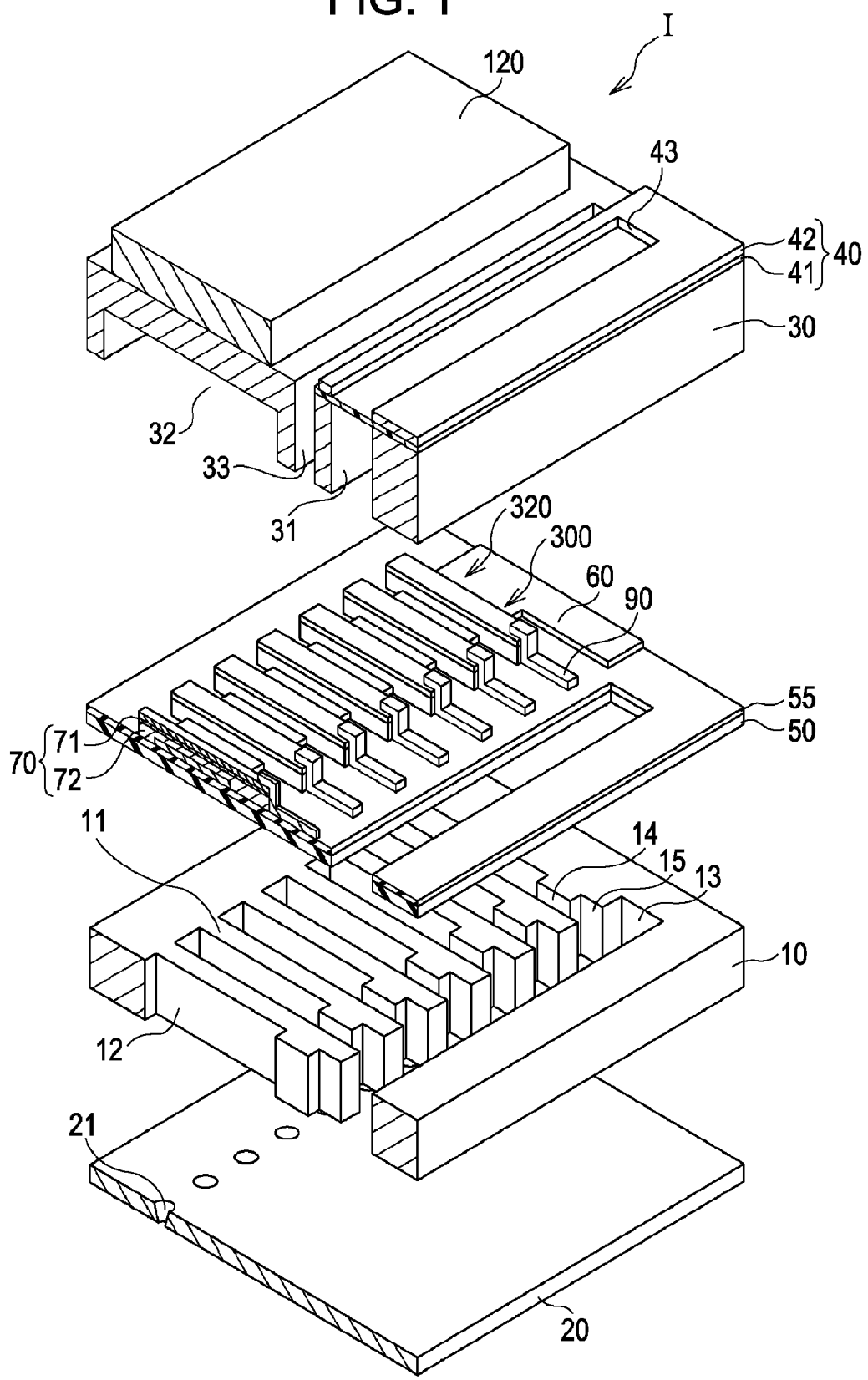
FIG. 1 is an exploded perspective view schematically showing the configuration of a recording head according to Embodiment 1 of the invention.
Figure 2A:
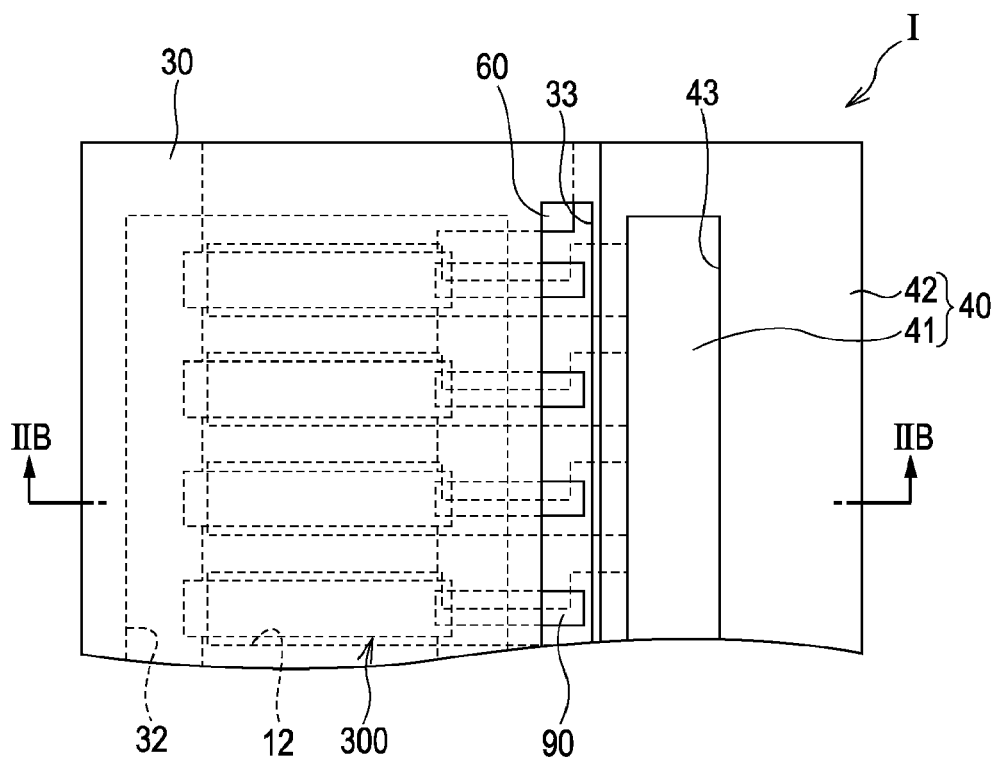
FIGS. 2A and 2B are a plan view of the recording head according to Embodiment 1 and a cross-sectional view thereof.
Figure 2B:
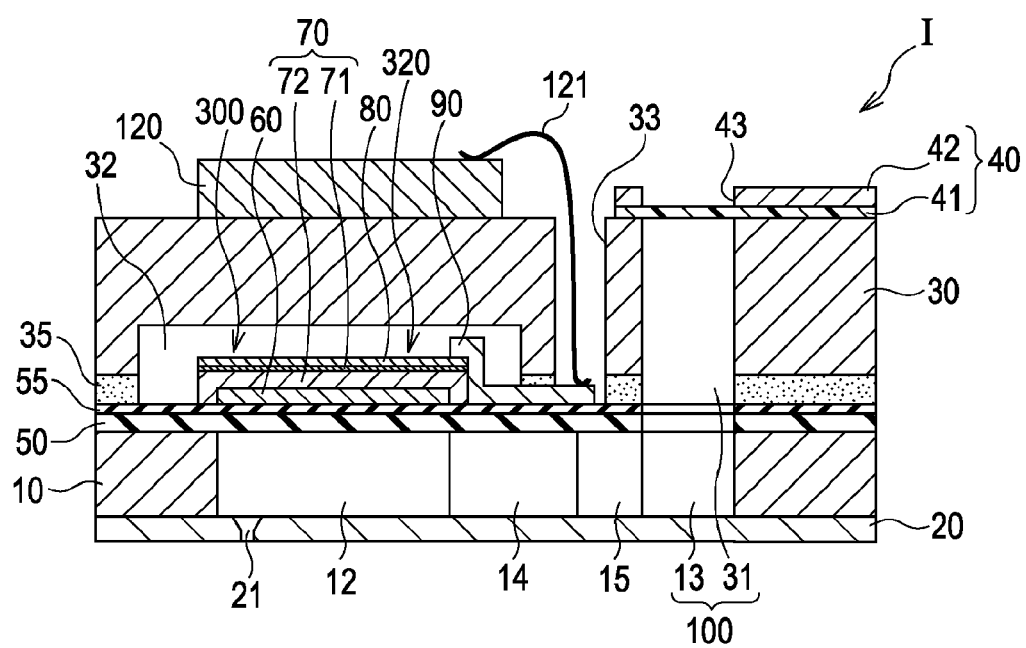
Figure 3:
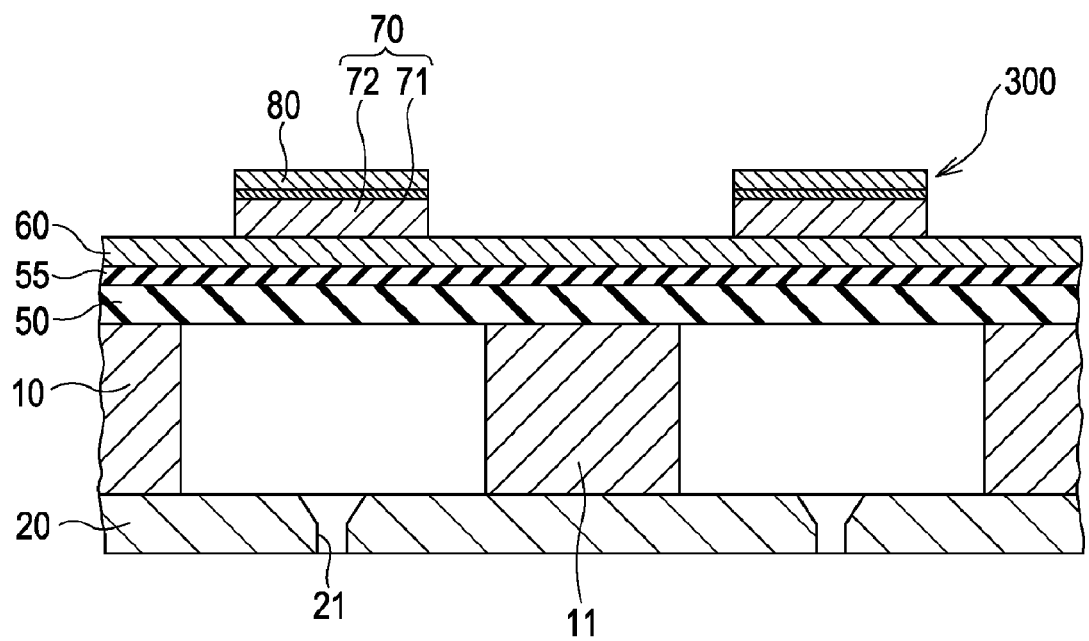
FIG. 3 is an enlarged cross-sectional view of major parts of the recording head according to Embodiment 1.

FIG. 1 is an exploded perspective view schematically showing the configuration of an ink jet recording head as an example of a liquid ejecting head according to Embodiment 1 of the invention. FIGS. 2A and 2B are a plan view of FIG. 1 and a cross-sectional view taken along line IIB-IIB shown in FIG. 2A. FIG. 3 is an enlarged cross-sectional view of major parts shown in FIGS. 2A and 2B.

As shown in the above-described figures, a flow path forming substrate 10 according to this embodiment is formed from a silicon monocrystal substrate having the plane orientation of (110). On one face of the flow path forming substrate 10, an elastic film 50 is formed which has a thickness of 0.5 to 2 μm and which is formed in advance of silicon dioxide by thermal oxidation.

In the flow path forming substrate 10, pressure generating chambers 12 that are partitioned along a plurality of partition walls 11 are arranged in the width direction (short side direction) of the flow path forming substrate 10 by performing anisotropic etching from the other side. In addition, on one end portion side of the flow path forming substrate 10 in the longitudinal direction of the pressure generating chamber 12, ink supplying paths 14 and communication paths 15 are partitioned along the partition wall 11. In one end of the communication path 15, a communication portion 13 is formed that configures a part of a reservoir 100 that becomes a common ink chamber (liquid chamber) of the pressure generating chambers 12. In other words, in the flow path forming substrate 10, a liquid flowing path that is formed of the pressure generating chamber 12, the communication portion 13, the ink supplying path 14, and the communication path 15 is disposed.

The ink supplying path 14 is communicated with one end portion side of the pressure generating chamber 12 in the longitudinal direction and has a cross-sectional area that is smaller than that of the pressure generating chamber 12. For example, according to this embodiment, the ink supplying path 14 is formed to have a width smaller than that of the pressure generating chamber 12 by narrowing the flow path of the pressure generating chamber 12 side between the reservoir 100 and the pressure generating chamber 12 in the width direction. In addition, as described above, according to this embodiment, the ink supplying path 14 is formed by narrowing the flow path from one side. However, the ink supplying path may be formed by narrowing the width of the flow path from both sides thereof. Alternatively, the ink supplying path may be formed not by narrowing the width of the flow path but by narrowing the flow path in the thickness direction. In addition, each communication path 15 is communicated with the side of the ink supplying path 14 that is located opposite to the pressure generating chamber 12 and has a cross-sectional area that is larger than that of the ink supplying path 14 in the width direction (short side direction). In this embodiment, the communication path 15 is formed so as to have a cross-sectional area that is the same as that of the pressure generating chamber 12.

In other words, in the flow path forming substrate 10, the pressure generating chambers 12, the ink supplying paths 14 that have a cross-sectional area smaller than that of the pressure generating chamber 12 in the short side direction, and the communication path 15 that is communicated with the ink supplying paths 14 and has a cross-sectional area larger than that of the ink supplying path 14 in the short side direction, are arranged so as to be partitioned by the plurality of partition walls 11.

In addition, on the opening face side of the flow path forming substrate 10, a nozzle plate 20, in which a nozzle opening 21 is formed that is communicated with an area near the end portion of each pressure generating chamber 12 on the side opposite to the ink supplying path 14, is fixed with an adhesive agent, a thermal welding film or the like. The nozzle plate 20 is formed, for example, of glass ceramics, a silicon monocrystal substrate, stainless steel or the like so as to have a thickness of 0.01 to 1 mm and a linear expansion coefficient of 2.5 to 4.5 $[\times 10^{-6}/^\circ$ C.] in temperature of equal to or less than 300° C.

On the other hand, on the side of the flow path forming substrate 10 that is located opposite to the opening face, the elastic film 50, for example, having a thickness of about 1.0 μm is formed as described above. An insulating film 55, for example, having a thickness of about 0.4 μm is formed on the elastic film 50. In addition, on the insulating film 55, a first electrode 60, for example, having a thickness of about 0.2 μm, a piezoelectric layer 70, for example, having a thickness of about 1.1 μm, and a second electrode 80, for example, having a thickness of about 0.05 μm are formed to be stacked by a performing processes to be described later, and whereby a piezoelectric element 300 is configured. Here, the piezoelectric element 300 is the portion that includes the first electrode 60, the piezoelectric layer 70, and the second electrode 80. Generally, while any one electrode of the piezoelectric element 300 is used as a common electrode, the other electrode and the piezoelectric layer 70 are configured by being patterned for each pressure generating chamber 12. Here, a piezoelectric body active portion 320 is any portion configured by any one electrode that is patterned and the piezoelectric layer 70 in which piezoelectric deformation is generated due to the application of a voltage to the anode electrode. In this embodiment, the first electrode 60 is used as the common electrode of the piezoelectric element 300, and the second electrode 80 is used as an individual electrode of the piezoelectric element 300. However, the first electrode 60 and the second electrode 80 may be used reversely based on the driving circuit or wirings. Here, the piezoelectric element 300 and a vibration plate that is displaced in accordance with driving of the piezoelectric element 300 are referred to as an actuator device. In addition, in the above-described example, the elastic film 50, the insulating film 55, and the first electrode 60 act as a vibration plate. However, it is apparent that the invention is not limited thereto. For example, only the first electrode 60 may be configured to act as the vibration plate without disposing the elastic film 50 and the insulating film 55. Alternatively, the piezoelectric element 300 may be configured to also substantially serve as the vibration plate.

The piezoelectric layer 70 is a crystallized film having a perovskite structure which is formed of a piezoelectric material of an oxide having a polarized structure that is formed on the first electrode 60. A ferroelectric material such as lead zirconium titanate (PZT) or the ferroelectric material to which metal oxide such as niobe oxide, nickel oxide, or magnesium oxide is added may be appropriately used for the piezoelectric layer 70. In particular, lead titanate ($PbTiO_3$), lead zirconate titanate (Pb(Zr, Ti) $O_3$), lead zirconate ($PbZrO_3$), lead lanthanum titanate ((Pb, La) ($TiO_3$), lead lanthanum zirconate-titanate ((Pb, La) (Zr, Ti) $O_3$), lead magnesium niobate zirconium titanate (Pb(Zr, Ti) (Mg, Nb) $O_3$), or the like may be used for the piezoelectric layer 70. The thickness of the piezoelectric layer 70 is suppressed so as not to generate any cracks in the manufacturing process and is formed to be thick enough to exhibit sufficient displacement characteristics. For example, in this embodiment, the piezoelectric layer 70 is formed to have a thickness of about 1 to 2 µm.

In addition, on the surface layer of the piezoelectric layer 70 that is located on the second electrode 80 side, an amorphous layer 71 formed of a non-crystal (amorphous) material is arranged. In other words, the piezoelectric layer 70 is constituted by a main body 72 of the piezoelectric layer that has a crystal structure and the amorphous layer 71 that is formed of an amorphous material.

The above-described amorphous layer 71 has a composition that is the same as that of the main body 72 of the piezoelectric layer. However, the amorphous layer 71 is non-crystal (amorphous) that does not have a crystal structure. In addition, the amorphous layer 71 is not dotted on the surface layer of the piezoelectric layer 70 and uniformly exists as a layer on the surface of the piezoelectric layer 70. As described above, by arranging the amorphous layer 71 on the surface layer of the piezoelectric layer 70 that is located on the second electrode 80 side, the main body 72 of the piezoelectric layer is not brought into direct contact with the second electrode 80. Accordingly, a grain boundary, a domain boundary or the like that is the crystal structure of the main body 72 of the piezoelectric layer can be prevented from becoming a leakage path. In addition, the insulating property of the piezoelectric layer 70 is improved. As a result, the withstand voltage characteristic of the piezoelectric element 300 can be improved. In addition, the generation of the leakage path can be suppressed. Accordingly, heat generation of the piezoelectric element 300 can be suppressed for a case where the piezoelectric element 300 is repeatedly driven, and the destruction of the piezoelectric element 300 (in particular, the piezoelectric layer 70) due to heat can be suppressed. Therefore, the piezoelectric element 300 having a longer life can be achieved. When the second electrode 80 is brought into direct contact with the crystallized area of the piezoelectric layer 70, that is, the main body 72 of the piezoelectric layer, a domain boundary or a grain boundary in the crystallized area becomes a leakage path, and accordingly, there is destruction of or heat generation in the piezoelectric layer 70.

In addition, the amorphous layer 71 is amorphous. Thus, even when an electric field is generated between the first electrode 60 and the second electrode 80, the amorphous layer is scarcely displaced. Accordingly, when the amorphous layer 71 is too thick, the displacement of the main body 72 of the piezoelectric layer is blocked. Thus, it is preferable that the amorphous layer 71 is formed to be relatively thin but still sufficient so as not to generate any leakage path in the main body 72 of the piezoelectric layer. For example, according to this embodiment, the amorphous layer 71 is formed to have a thickness of 1.1 nm compared to a total thickness of the piezoelectric layer 70 of 1.1 µm.

The above-described piezoelectric layer 70, for example, may be formed by using the so-called Sol-gel method in which a so-called sol acquired by dissolving and dispersing a metal organic material in a solvent is coated and dried so as to be a gel, and the gel is baked at a high temperature to acquire the piezoelectric layer 70 formed of metal oxide. In addition, for forming the amorphous layer 71, the main body 72 of the piezoelectric layer is formed, for example, by using the Sol-gel method, and then, the surface of the main body 72 of the piezoelectric layer is exposed to plasma for a predetermined time, whereby the amorphous layer 71 that is amorphous can be formed as the surface layer of the main body 72 of the piezoelectric layer. It is apparent that the method of forming the piezoelectric layer 70 is not particularly limited thereto. For example, as the method of forming the piezoelectric layer 70, an MOD method or a sputtering method may be used. In addition, it is apparent that the method of forming the amorphous layer 71 is not limited to the above-described method.

For example, the amorphous layer 71 is crystallized when the piezoelectric layer 70 is heat-treated again (generally referred to as an annealing process) after the piezoelectric layer 70 formed by the main body 72 of the piezoelectric layer and the amorphous layer 71 is formed. Accordingly, it is preferable that heat treatment at a high temperature such as an annealing process is not performed for the piezoelectric layer 70 according to an embodiment of the invention after the amorphous layer 71 is formed.

In addition, a lead electrode 90, formed for example of gold (Au) or the like, that is extracted from near the end portion of the ink supplying path 14 side and is disposed to extend up to a position located on the insulating film 55, is connected to each second electrode 80 that is the individual electrode of the piezoelectric element 300.

On the flow path forming substrate 10 on which the above-described piezoelectric elements 300 are formed, that is, on the first electrode 60, the elastic film 50, and the lead electrode 90, a protection substrate 30 that has the reservoir portion 31 configuring at least a part of the reservoir 100 is bonded through an adhesive agent 35. According to this embodiment, the reservoir portion 31 is formed so as to pass through the protection substrate 30 in the thickness direction and extend in the width direction of the pressure generating chambers 12. As described above, the reservoir portion 31 is communicated with the communication portion 13 of the flow path forming substrate 10 and configures a reservoir 100 that becomes the common ink chamber of the pressure generating chambers 12.

In addition, in an area of the protection substrate 30 that faces the piezoelectric elements 300, a piezoelectric element holding portion 32 is formed having a space that does not block movement of the piezoelectric elements 300. As long as the piezoelectric element holding portion 32 has a space that does not block the movement of the piezoelectric elements 300, the space may be sealed or may not be sealed.

It is preferable that a material such as glass, a ceramic material or the like that has a same rate of thermal expansion as that of the flow path forming substrate 10 is used for the above-described protection substrate 30. In this embodiment, the protection substrate 30 is formed by using a silicon monocrystal substrate that is formed from the same material as that of the flow path forming substrate 10.

In addition, a through hole 33 that passes through the protection substrate 30 in the thickness direction is formed in the protection substrate 30. In addition, a portion of each lead electrode 90 near the end portion thereof that is extracted from each piezoelectric element 300 is disposed to be exposed to the inside of the through hole 33.

In addition, a driving circuit 120 that is used for driving the piezoelectric elements 300 arranged to be parallel to one another is fixed on the protection substrate 30. As the driving circuit 120, for example, a circuit substrate, a semiconductor integrated circuit (IC), or the like may be used. In addition, the driving circuit 120 and the lead electrodes 90 are electrically connected to each other through a connection wiring 121 that is formed of a conductive wire such as a bonding wire.

In addition, a compliance substrate 40 that is formed of a sealing film 41 and a fixing plate 42 is bonded on the protection substrate 30. Here, the sealing film 41 is formed of a flexible material having a low rigidity (for example, a poly phenylene sulfide (PPS) film having a thickness of 6 μm), and one-side face of the reservoir portion 31 is sealed by the sealing film 41. The fixing plate 42 is formed of a hard material [for example, stainless steel (SUS or the like) having a thickness of 30 μm] such as a metal. An area of the fixing plate 42 that faces the reservoir 100 becomes an opening portion 43 that is completely removed in the thickness direction. Accordingly, one-side face of the reservoir 100 is sealed only by the sealing film 41 that has flexibility.

According to the ink jet recording head of this embodiment, the inside is filled with ink from the reservoir 100 up to the nozzle opening 21 by inserting ink from an ink introducing opening that is connected to an external ink supplying unit not shown in the figure, and then, a voltage is applied between the first electrode 60 and the second electrode 80 corresponding to each pressure generating chamber 12 in accordance with a recording signal transmitted from the driving circuit 120, whereby the elastic film 50, the insulating film 55, the first electrode 60, and the piezoelectric layer 70 are deformed so as to be bent. Accordingly, the pressure inside each pressure generating chamber 12 is increased, and whereby ink droplets are ejected from the nozzle opening 21.

Other Embodiments

An embodiment of the invention has been described as above. However, the basic configuration according to an embodiment of the invention is not limited thereto. For example, in the above-described Embodiment 1, the amorphous layer 71 is arranged on the second electrode 80 side. However, the invention is not limited thereto. Thus, the amorphous layer 71 may be arranged on the first electrode 60 side of the piezoelectric layer 70. When the amorphous layer 71 is to be formed on the first electrode 60 side as described above, the piezoelectric element in which the amorphous layer 71 is formed on the first electrode 60 side can be formed, for example, by sequentially forming the second electrode, the main body 72 of the piezoelectric layer, the amorphous layer, and the first electrode on a substrate so to be stacked and then, by transferring the piezoelectric element on the flow path forming substrate 10.

In addition, in the above-described Embodiment 1, a silicon monocrystal substrate of which the crystal plane orientation is the (110) plane has been exemplified as the flow path forming substrate 10. However, the invention is not limited thereto. For example, a silicon monocrystal substrate of which the crystal plane orientation is the (100) plane may be used as the flow path forming substrate 10. Alternatively, a material such as an SOI substrate or glass may be used for the flow path forming substrate 10.

In addition, in the above-described Embodiment 1, the piezoelectric element 300 in which the first electrode 60, the piezoelectric layer 70, and the second electrode 80 are sequentially stacked on the substrate (flow path forming substrate 10) has been described as an example. However, the invention is not limited thereto. Thus, for example, the invention may be applied to a piezoelectric element of a vertically vibrating type in which a piezoelectric material and an electrode forming material are alternately stacked so as to expand or contract in the axis direction.

Figure 4:
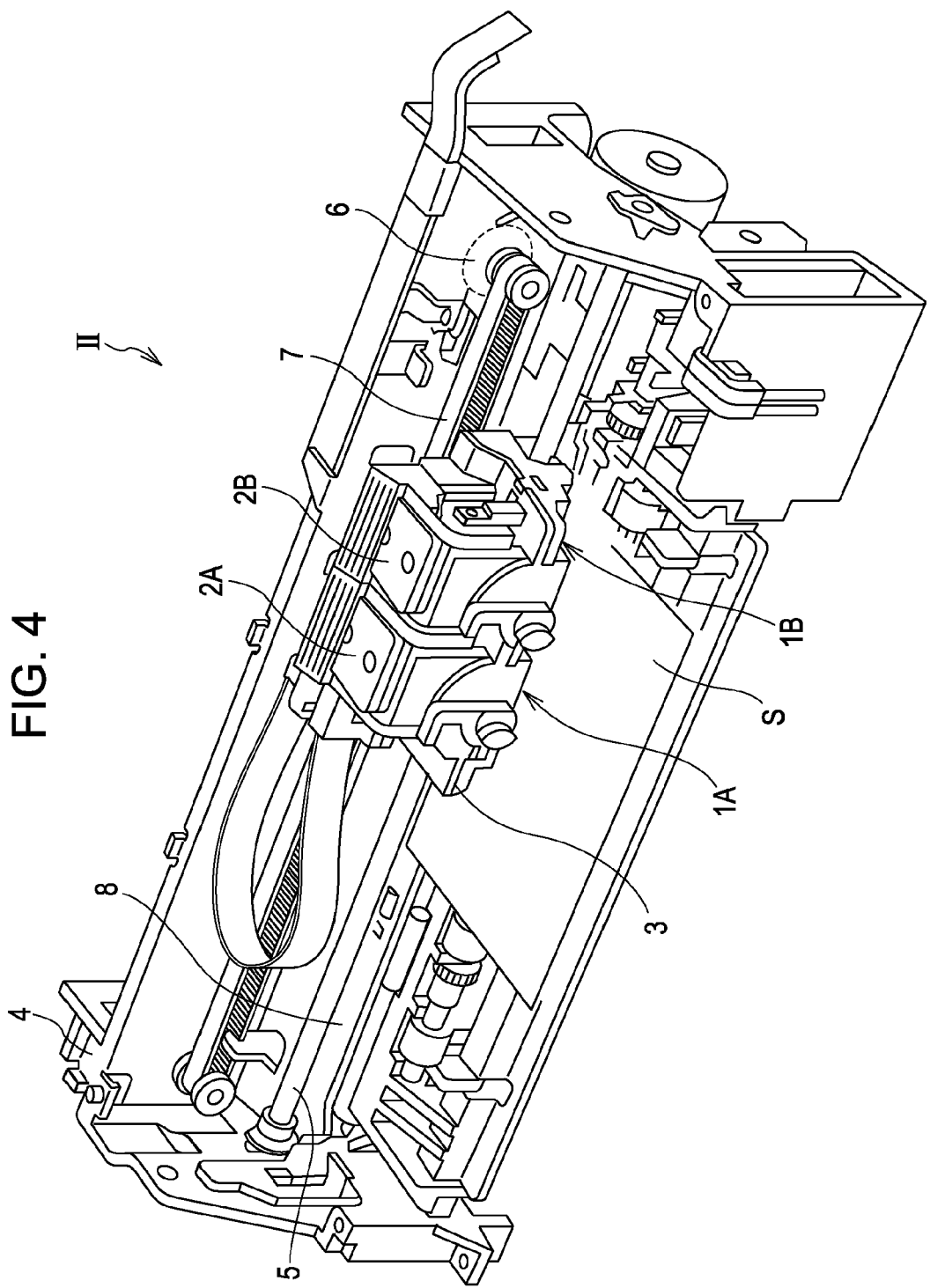
FIG. 4 is a diagram showing a schematic configuration of a recording apparatus according to an embodiment of the invention.

In addition, the ink jet recording head configures a part of a recording head unit that includes an ink flowing path communicated with an ink cartridge or the like and is mounted in an ink jet recording apparatus. FIG. 4 is a schematic diagram showing an example of the ink jet recording apparatus.

In an ink jet recording apparatus II shown in FIG. 4, cartridges 2A and 2B, which configure the ink supplying unit, are disposed so as to be attached to and detachable from recording head units 1A and 1B having the ink jet recording heads I. In addition, a carriage 3 in which the recording head units 1A and 1B are mounted is disposed in a carriage shaft 5, which is installed to an apparatus main body 4, so as to be able to freely move in the shaft direction. These recording head units 1A and 1B, for example, are assumed to eject a black ink composition and a color ink composition.

Then, as the driving force of a driving motor 6 is transferred to the carriage 3 through a plurality of gears not shown in the figure and a timing belt 7, the carriage 3 in which the recording head units 1A and 1B are mounted is moved along the carriage shaft 5. On the other hand, a platen 8 is disposed along the carriage shaft 5 in the apparatus main body 4. A recording sheet S that is a recording medium such as paper, which is fed by a paper feed roller not shown in the figure or the like, is transported while being wound around the platen 8.

In addition, in the above-described Embodiment 1, the ink jet recording head has been described using an example of a liquid ejecting head. However, the invention is for all the liquid ejecting heads using a broad meaning and may also be applied to liquid ejecting heads that eject liquid other than ink. As other types of liquid ejecting heads, for example, there are various recording heads that are used for an image recording apparatus such as a printer, a coloring material ejecting head that is used for manufacturing a color filter of a liquid crystal display or the like, an electrode material ejecting head that is used for forming an electrode of an organic EL display, an FED (electric-field emission display), or the like, a bioorganic material ejecting head that is used for manufacturing a bio chip, and the like.

In addition, the invention is not limited to a piezoelectric element mounted in a liquid ejecting head that is represented by an ink jet recording head and may be applied to a piezoelectric element that is mounted in any other apparatus.

What is claimed is:

1. A liquid ejecting head comprising:
   a pressure generating chamber that is in communication with a nozzle opening; and
   a piezoelectric element including a first electrode formed above the pressure generating chamber, a piezoelectric layer formed above the first electrode, and a second electrode formed above the piezoelectric layer,
   wherein an amorphous layer including an amorphous material is formed on a surface of the piezoelectric layer at the second electrode side,
   wherein the amorphous layer is a uniform layer on the piezoelectric layer surface that is not dotted on the piezoelectric layer surface such that the amorphous layer covers the piezoelectric layer surface between the piezoelectric layer and the second electrode so that the piezoelectric layer is not brought into direct contact with the second electrode.

2. The liquid ejecting head according to claim 1, wherein the piezoelectric layer contains lead, zirconium, and titanium.

3. The liquid ejecting head according to claim 1, wherein the piezoelectric layer and the amorphous layer have the same composition.

4. The liquid ejecting head according to claim 1, wherein the second electrode is formed of iridium.

5. A liquid ejecting apparatus comprising the liquid ejecting head according to claim 1.

6. A piezoelectric actuator comprising:
a substrate;
a piezoelectric layer that is formed on the upper side of the substrate;
a first electrode that is formed on the substrate side of the piezoelectric layer; and
a second electrode that is formed on the side of the piezoelectric layer that is located opposite to the first electrode,
wherein an amorphous layer formed of an amorphous material is included on a surface layer of the second electrode side of the piezoelectric layer,
wherein the amorphous layer is a uniform layer on the piezoelectric layer surface that is not dotted on the piezoelectric layer surface such that the amorphous layer covers the piezoelectric layer surface between the piezoelectric layer and the second electrode so that the piezoelectric layer is not brought into direct contact with the second electrode.

* * * * *